US012685048B2

(12) United States Patent (10) Patent No.: US 12,685,048 B2
Oikawa et al. (45) Date of Patent: Jul. 14, 2026

(54) SUBSTRATE PROCESSING METHOD AND SUBSTRATE PROCESSING APPARATUS

(71) Applicant: Tokyo Electron Limited, Tokyo (JP)

(72) Inventors: Masami Oikawa, Iwate (JP); Yuya Takamura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 612 days.

(21) Appl. No.: 18/188,758

(22) Filed: Mar. 23, 2023

(65) Prior Publication Data

US 2023/0326762 A1 Oct. 12, 2023

(30) Foreign Application Priority Data

Apr. 6, 2022 (JP) ................................. 2022-063580

(51) Int. Cl.
| | |
|---|---|
| *H10P 30/40* | (2026.01) |
| *C23C 16/40* | (2006.01) |
| *C23C 16/56* | (2006.01) |
| *H10D 64/01* | (2025.01) |
| *H10P 95/00* | (2026.01) |

(52) U.S. Cl.
CPC ............ *H10P 30/40* (2026.01); *C23C 16/401* (2013.01); *C23C 16/56* (2013.01); *H10P 95/94* (2026.01); *H10D 64/0134* (2026.01)

(58) Field of Classification Search
CPC ........... H01L 21/31155; H01L 21/3003; H01L 21/28185; C23C 16/401; C23C 16/56
See application file for complete search history.

(56) References Cited

U.S. PATENT DOCUMENTS

| | | | | |
|---|---|---|---|---|
| 2008/0308905 A1* | 12/2008 | Park | ................... | H01L 21/3003 |
| | | | | 438/525 |
| 2010/0105192 A1* | 4/2010 | Akae | ................. | H01L 21/02337 |
| | | | | 438/758 |
| 2014/0206189 A1* | 7/2014 | Yamasaki | ............... | C23C 16/56 |
| | | | | 438/680 |
| 2016/0005621 A1* | 1/2016 | Toda | ................. | H01L 21/67109 |
| | | | | 156/345.24 |
| 2019/0206885 A1* | 7/2019 | Wang | .................... | H01L 21/765 |
| 2021/0272979 A1* | 9/2021 | Noguchi | ........... | H01L 21/32105 |

FOREIGN PATENT DOCUMENTS

| | | | |
|---|---|---|---|
| JP | 2000-077621 | | 3/2000 |
| JP | 2004214305 A | * | 7/2004 |

* cited by examiner

*Primary Examiner* — Jose I Hernandez-Kenney
(74) *Attorney, Agent, or Firm* — IPUSA, PLLC

(57) ABSTRACT

A substrate processing method includes: preparing a substrate having a target film on a surface; forming a barrier film that covers the target film; supplying a deuterium gas and an oxygen gas to the target film covered with the barrier film, thereby implanting deuterium into the target film; and removing the barrier film after the deuterium is implanted into the target film.

20 Claims, 5 Drawing Sheets

SUBSTRATE PROCESSING METHOD AND SUBSTRATE PROCESSING APPARATUS

CROSS-REFERENCE TO RELATED APPLICATIONS

The present application is based on and claims priority to Japanese Patent Application No. 2022-063580 filed on Apr. 6, 2022, the contents of which are incorporated herein by reference in their entirety.

BACKGROUND OF THE INVENTION

Field of the Invention

The present disclosure relates to a substrate processing method and a substrate processing apparatus.

Description of the Related Art

A semiconductor memory device is known in which deuterium is contained at the interface between the semiconductor substrate and the gate insulating film of the transistor at a ratio greater than the ratio of deuterium to hydrogen present in nature (See, for example, Japanese Laid-Open Patent Publication No. 2000-77621).

SUMMARY OF THE INVENTION

According to one aspect of the present disclosure, a substrate processing method includes: preparing a substrate having a target film on a surface; forming a barrier film that covers the target film; supplying a deuterium gas and an oxygen gas to the target film covered with the barrier film, thereby implanting deuterium into the target film; and removing the barrier film after the deuterium is implanted into the target film.

DESCRIPTION OF THE EMBODIMENTS

Figure 1:
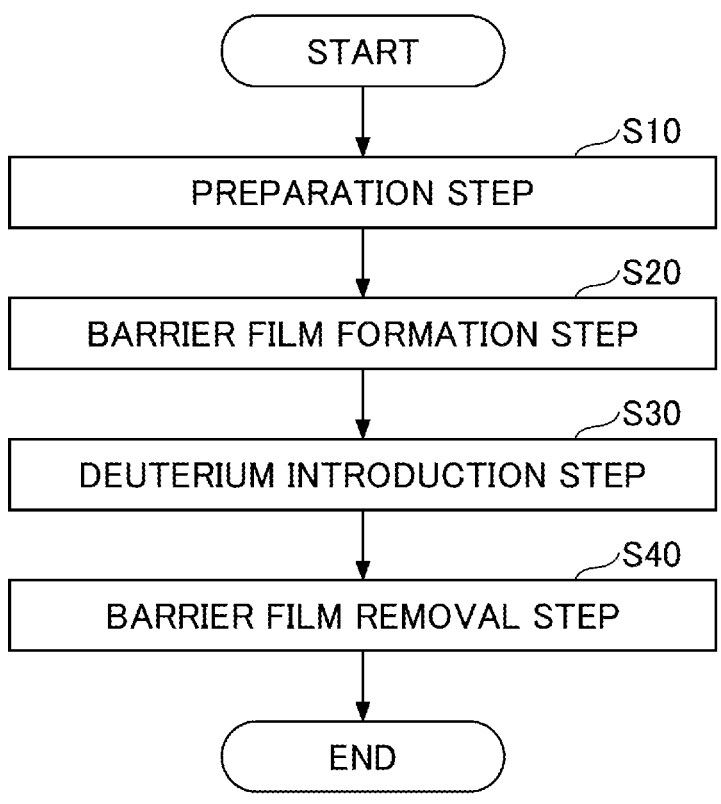
FIG. 1 is a flowchart illustrating a substrate processing method according to the embodiment.

Hereinafter, non-limiting illustrative embodiments of the present disclosure will be described with reference to the accompanying drawings. In all accompanying drawings, the same or corresponding components or parts are denoted by the same or corresponding reference numerals, and overlapping descriptions are omitted.

[Substrate Processing Method]

Referring to FIGS. 1 and 2, a substrate processing method according to the embodiment will be described. As illustrated in FIG. 1, the substrate processing method according to the embodiment includes a preparation step S10, a barrier film formation step S20, a deuterium introduction step S30, and a barrier film removal step S40.

Figure 2A:
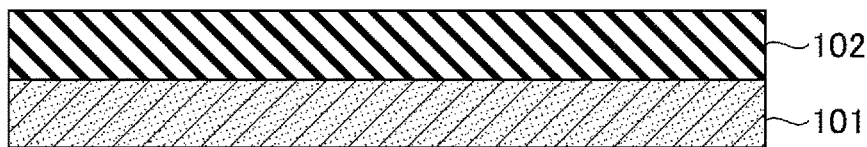
FIGS. 2A to 2D are schematic cross-sectional diagrams illustrating the substrate processing method according to the embodiment.

In the preparation step S10, as illustrated in FIG. 2A, a substrate 101 having a target film 102 on its surface is prepared. The substrate 101 is, for example, a silicon wafer. The target film 102 is, for example, a film containing silicon and nitrogen. The target film 102 is, for example, a silicon nitride film or a silicon oxynitride film.

Figure 2B:
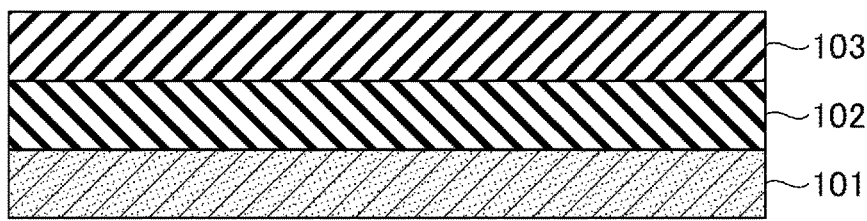

The barrier film formation step S20 is performed after the preparation step S10. In the barrier film formation step S20, a barrier film 103 is formed on the target film 102, as illustrated in FIG. 2B. The barrier film 103 covers the target film 102 and prevents oxygen from entering the target film 102. The barrier film 103 is a film in which an amount of passing deuterium is larger than an amount of passing oxygen. The barrier film 103 is formed of, for example, silicon oxide, aluminum oxide, or polysilicon. The method of forming the barrier film 103 is not particularly limited. For example, the barrier film 103 may be formed by atomic layer deposition (ALD) or chemical vapor deposition (CVD).

Figure 2C:
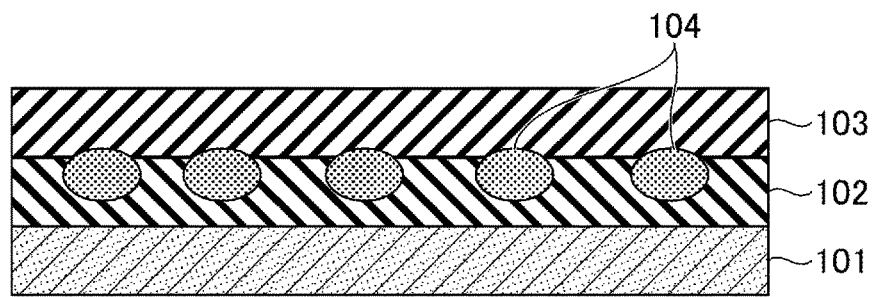

The deuterium introduction step S30 is performed after the barrier film formation step S20. In the deuterium introduction step S30, as illustrated in FIG. 2C, a deuterium gas and an oxygen gas are supplied to the target film 102 covered with the barrier film 103, and deuterium 104 is implanted into the target film 102. The target film 102 is covered with the barrier film 103 in which the amount of passing the deuterium 104 is larger than the amount of passing oxygen. Therefore, the deuterium 104 passes through the barrier film 103 and is implanted into the target film 102, whereas oxygen is blocked by the barrier film 103 and is unlikely to be implanted into the target film 102. Thus, in the deuterium introduction step S30, the deuterium 104 can be implanted into the target film 102 while preventing oxygen implantation into the target film 102.

Figure 2D:
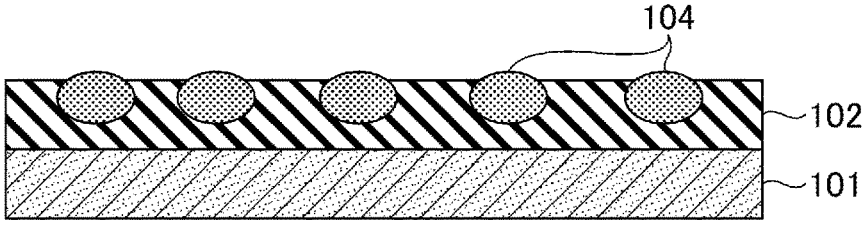

The barrier film removal step S40 is performed after the deuterium introduction step S30. In the barrier film removal step S40, as illustrated in FIG. 2D, the barrier film 103 is removed after the deuterium 104 is implanted into the target film 102. The method of removing the barrier film 103 is not particularly limited. When the barrier film 103 is formed of silicon oxide, for example, the barrier film 103 may be removed by chemical oxide removal (COR), which chemically etches without generating plasma. In the COR, a hydrogen fluoride (HF) gas and an ammonia ($NH_3$) gas are supplied, and the hydrogen fluoride gas and the ammonia gas are reacted with silicon oxide to produce ammonium silicofluoride (($NH_4$)$_2$$SiF_6$), which is then sublimated by heating. Accordingly, the barrier film 103 formed by silicon oxide can be selectively etched and removed, leaving the target film 102 remaining. When the barrier film 103 is formed of polysilicon, a chlorine trifluoride ($ClF_3$) gas or a fluorine ($F_2$) gas are supplied, for example. Accordingly, the barrier film 103 formed by polysilicon can be selectively etched and removed, leaving the target film 102 remaining.

As a result, the target film 102 implanted with the deuterium 104 is formed.

According to the substrate processing method according to the embodiment, in the deuterium introduction step S30, the deuterium gas and the oxygen gas are supplied to the target film 102 covered with the barrier film 103, and the deuterium 104 is implanted into the target film 102. Thus, the deuterium 104 can be implanted into the target film 102 while preventing oxygen implantation into the target film 102 by the barrier film 103. Therefore, the target film 102 with a high concentration of the deuterium 104 and reduced surface oxidation can be formed.

Preferably, the barrier film formation step S20, the deuterium introduction step S30, and the barrier film removal step S40 are performed in the same processing chamber. Accordingly, the downtime can be shortened. In addition, because there is no need to transfer substrates between different processing chambers, the risk of particle generation can be reduced. However, the barrier film formation step S20, the deuterium introduction step S30, and the barrier film removal step S40 may be performed in different processing chambers. At least two of the barrier film formation step S20, the deuterium introduction step S30, and the barrier film removal step S40 may be performed in the same processing chamber.

[Substrate Processing Apparatus]

Figure 3:
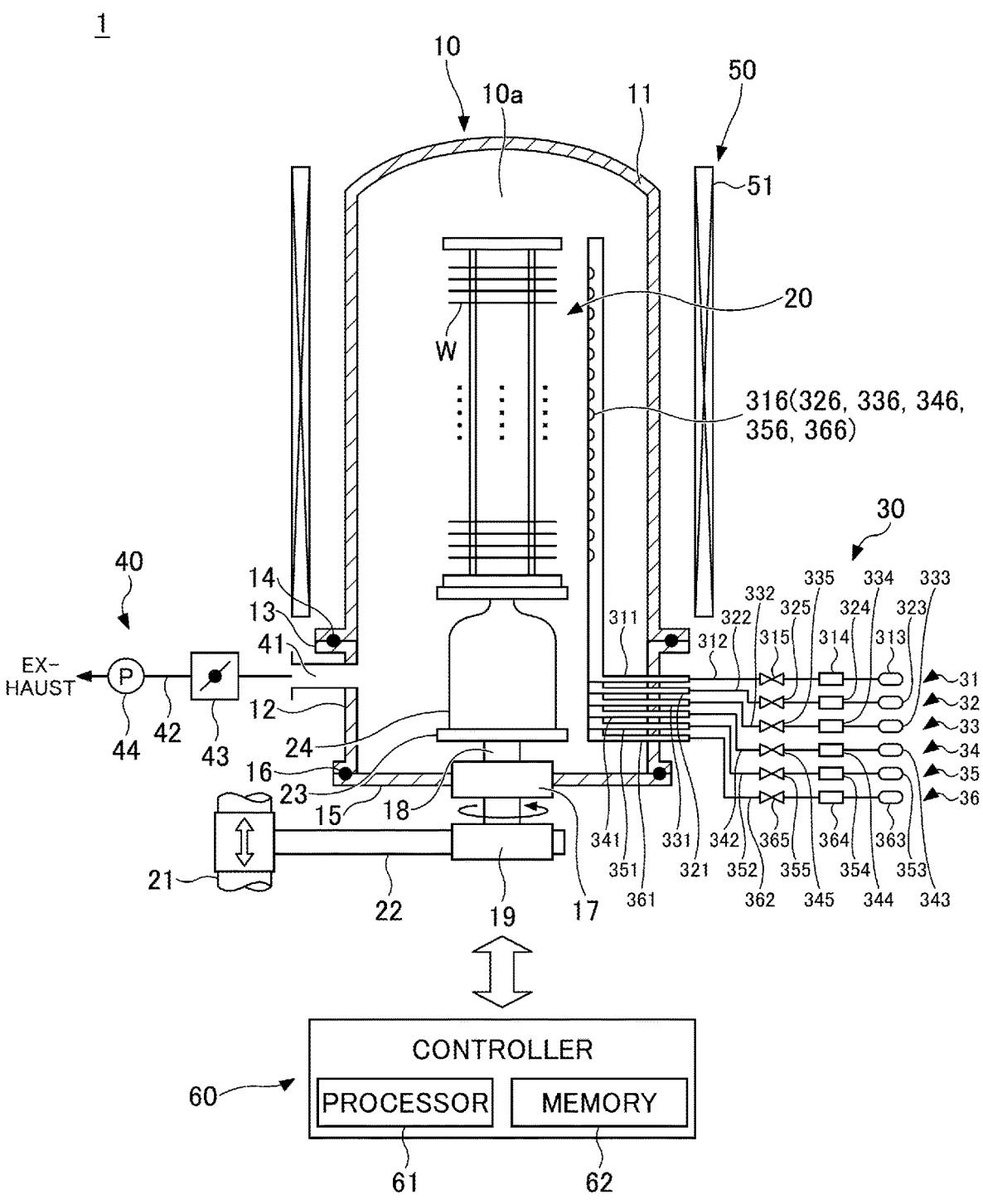
FIG. 3 is a schematic diagram illustrating a substrate processing apparatus according to the embodiment.

Referring to FIG. 3, the substrate processing apparatus according to the embodiment will be described. As illustrated in FIG. 3, a substrate processing apparatus 1 includes a processing chamber 10, a boat 20, a gas supplier 30, an exhauster 40, a heating unit 50, and a controller 60.

The processing chamber 10 is formed in a cylindrical shape having a processing space 10a therein. Heat treatment is performed in the processing chamber with substrates W are housed in the processing space 10a. The processing chamber 10 includes a cylindrical body 11 having a substantially hemispherical ceiling and an open lower end, a manifold 12 connected to the lower end of the cylindrical body 11, and a lid 15 connected to a lower end of the manifold 12.

The cylindrical body 11 is formed of a heat-resistant material such as quartz. The cylindrical body 11 extends longer in the vertical direction (height direction) and constitutes most of the processing space 10a of the processing chamber 10. In FIG. 3, the processing chamber 10 is illustrated as having one cylindrical body 11, but it is not limited to this, and for example, a multiple structure in which a plurality of cylinders (outer cylinder and inner cylinder) are stacked concentrically may be adopted.

The manifold 12 and the lid 15 are formed of, for example, stainless steel. The manifold 12 includes a flange 13 at the upper end, and supports the lower end of the cylindrical body 11 with the flange 13. The lower end of the cylindrical body 11 and the flange 13 are airtightly connected via a seal 14 such as an O-ring. Similarly, the lower end of the manifold 12 and the lid 15 are in airtight contact via a seal 16 such as an O-ring.

A rotating shaft 18 penetrates through the center of the lid 15 via a magnetic fluid seal 17. The rotating shaft 18 has a boat 20 on the top and is connected to a rotary drive 19, and rotates relative to the processing chamber 10 by rotation of the rotary drive 19. Accordingly, the boat 20 is rotated.

The lower part of the rotating shaft 18 is rotatably supported by an arm 22 of a lifting mechanism 21 such as a boat elevator. A rotating plate 23 is provided at the upper end of the rotating shaft 18, and the boat 20 is placed on the rotating plate 23 via a heat-retaining table 24 made of quartz. Therefore, the lid 15 and the boat 20 are vertically moved integrally by raising and lowering the elevating mechanism 21 so that the boat 20 can be accommodated and detached from the cylindrical body 11.

The boat 20 is a substrate holder that extends in the vertical direction (height direction) within the processing chamber 10 and holds a plurality of substrates W at predetermined intervals along the vertical direction. Each substrate W is placed on the boat 20, which is detached from the processing chamber by the lowering of the lifting mechanism 21. After each substrate W is placed, the boat 20 is inserted into the processing chamber 10 by the raising of the lifting mechanism 21.

The gas supplier 30 is configured so that various processing gases used in the substrate processing method described above can be introduced into the processing space 10a. The gas supplier 30 includes a deuterium supplier 31, an oxygen supplier 32, an inert gas supplier 33, a silicon-containing gas supplier 34, a hydrogen fluoride supplier 35, and an ammonia supplier 36.

The deuterium supplier 31 includes a deuterium supply pipe 311 inside the processing chamber 10, and a deuterium supply path 312 outside the processing chamber 10. The deuterium supply path 312 is provided with a deuterium source 313, a mass flow controller 314, and a deuterium valve 315 in order from upstream to downstream in the gas flow direction. Accordingly, the deuterium gas in the deuterium source 313 is controlled in supply timing by the deuterium valve 315, and is adjusted to a predetermined flow rate by the mass flow controller 314. The deuterium gas flows from the deuterium supply path 312 into the deuterium supply pipe 311, and is discharged from the deuterium supply pipe 311 into the processing chamber 10.

The oxygen supplier 32 includes an oxygen supply pipe 321 inside the processing chamber 10 and an oxygen supply path 322 outside the processing chamber 10. The oxygen supply path 322 is provided with an oxygen source 323, a mass flow controller 324, and an oxygen valve 325 in order from upstream to downstream in the gas flow direction. Accordingly, the oxygen gas in the oxygen source 323 is controlled in supply timing by the oxygen valve 325, and is adjusted to a predetermined flow rate by the mass flow controller 324. The oxygen gas flows from the oxygen supply path 322 into the oxygen supply pipe 321, and is discharged from the oxygen supply pipe 321 into the processing chamber 10.

The inert gas supplier 33 includes an inert gas supply pipe 331 inside the processing chamber 10, and an inert gas supply path 332 outside the processing chamber 10. The inert gas supply path 332 is provided with an inert gas source 333, a mass flow controller 334, and an inert gas valve 335 in order from upstream to downstream in the gas flow direction. Accordingly, the inert gas in the inert gas source 333 is controlled in supply timing by the inert gas valve 335, and is adjusted to a predetermined flow rate by the mass flow controller 334. The inert gas flows from the inert gas supply path 332 into the inert gas supply pipe 331, and is discharged from the inert gas supply pipe 331 into the processing chamber 10.

The silicon-containing gas supplier 34 includes a silicon-containing gas supply pipe 341 inside the processing chamber 10, and a silicon-containing gas supply path 342 outside the processing chamber 10. The silicon-containing gas supply path 342 is provided with a silicon-containing gas source 343, a mass flow controller 344, and a silicon-containing gas valve 345 in order from upstream to downstream in the gas flow direction. Accordingly, the silicon-containing gas in the silicon-containing gas source 343 is controlled in supply timing by the silicon-containing gas valve 345, and is adjusted to a predetermined flow rate by the mass flow controller 344. The silicon-containing gas flows from the silicon-containing gas supply path 342 into the silicon-containing gas supply pipe 341, and is discharged from the silicon-containing gas supply pipe 341 into the processing chamber 10.

The hydrogen fluoride supplier 35 includes a hydrogen fluoride supply pipe 351 inside the processing chamber 10, and a hydrogen fluoride supply path 352 outside the processing chamber 10. The hydrogen fluoride supply path 352 is provided with a hydrogen fluoride source 353, a mass flow controller 354, and a hydrogen fluoride valve 355 in order from upstream to downstream in the gas flow direction. Accordingly, the hydrogen fluoride gas in the hydrogen fluoride source 353 is controlled in supply timing by the hydrogen fluoride valve 355, and is adjusted to a predetermined flow rate by the mass flow controller 354. The hydrogen fluoride gas flows from the hydrogen fluoride supply path 352 into the hydrogen fluoride supply pipe 351, and is discharged from the hydrogen fluoride supply pipe 351 into the processing chamber 10.

The ammonia supplier 36 includes an ammonia supply pipe 361 inside the processing chamber 10, and an ammonia supply path 362 outside the processing chamber 10. The ammonia supply path 362 is provided with an ammonia source 363, a mass flow controller 364, and an ammonia valve 365 in order from upstream to downstream in the gas flow direction. Accordingly, the ammonia gas in the ammonia source 363 is controlled in supply timing by the ammonia valve 365, and is adjusted to a predetermined flow rate by the mass flow controller 364. The ammonia gas flows from the ammonia supply path 362 into the ammonia supply pipe 361, and is discharged from the ammonia supply pipe 361 into the processing chamber 10.

Each gas supply pipe (the deuterium supply pipe 311, the oxygen supply pipe 321, the inert gas supply pipe 331, the silicon-containing gas supply pipe 341, the hydrogen fluoride supply pipe 351, and the ammonia supply pipe 361) is formed of, for example, quartz, and fixed to the cylindrical body 11 or to the manifold 12. Each gas supply pipe extends linearly in the vicinity of the cylindrical body 11 along the vertical direction, bends in an L-shape in the manifold 12 and extends in the horizontal direction, and penetrates the manifold 12. Each gas supply pipe is provided along the circumferential direction of the cylindrical body 11 at the same height.

In the part of the deuterium supply pipe 311 located in the cylindrical body 11, a plurality of deuterium discharge ports 316 are provided. In the part of the oxygen supply pipe 321 located in the cylindrical body 11, a plurality of oxygen discharge ports 326 are provided. In the part of the inert gas supply pipe 331 located in the cylindrical body 11, a plurality of inert gas discharge ports 336 are provided. In the part of the silicon-containing gas supply pipe 341 located in the cylindrical body 11, a plurality of silicon-containing gas discharge ports 346 are provided. In the part of the hydrogen fluoride supply pipe 351 located in the cylindrical body 11, a plurality of hydrogen fluoride discharge ports 356 are provided. In the part of the ammonia supply pipe 361 located in the cylindrical body 11, a plurality of ammonia discharge ports 366 are provided.

Each of the discharge ports (the deuterium discharge ports 316, the oxygen discharge ports 326, the inert gas discharge ports 336, the silicon-containing gas discharge ports 346, the hydrogen fluoride discharge ports 356, and the ammonia discharge ports 366) are formed at a predetermined interval along the extending direction (vertical direction) of the gas supply pipes. Each of the discharge ports discharges gas in the horizontal direction. The interval between the discharge ports is set to be the same as the interval between the substrates W held by the boat 20, for example. The position of each of the discharge ports in the height direction is set to an intermediate position between the substrates W adjacent to each other in the height direction. Accordingly, each of the discharge ports can efficiently supply gas between the facing surfaces of the adjacent substrates W.

The gas supplier 30 may mix several kinds of gases and discharge the mixed gas from one supply pipe. Each of the gas supply pipes (the deuterium supply pipe 311, the oxygen supply pipe 321, the inert gas supply pipe 331, the silicon-containing gas supply pipe 341, the hydrogen fluoride supply pipe 351, and the ammonia supply pipe 361) may have a different shape or arrangement from each other. For example, in a configuration where the deuterium supply flow rate is large, the deuterium supply pipe 311 may be thicker than the oxygen supply pipe 321. The supply flow rate of the inert gas relative to the supply flow rate of the deuterium gas and the oxygen gas may be significantly low. The substrate processing apparatus 1 may be configured not to supply the inert gas. The substrate processing apparatus 1 may be configured to supply another gas in addition to the deuterium gas, the oxygen gas, the inert gas, the silicon-containing gas, the hydrogen fluoride gas, and the ammonia gas.

The exhauster 40 is provided in an exhaust port 41 formed in the upper side wall of the manifold 12. The exhauster 40 includes an exhaust path 42 connected to the exhaust port 41. The exhaust path 42 is provided with a pressure regulating valve 43 and a vacuum pump 44, in order from upstream to downstream in the gas flow direction. The exhauster 40 operates the pressure regulating valve 43 and the vacuum pump 44 based on the control of the controller 60, thereby adjusting the pressure in the processing chamber 10 with the pressure regulating valve 43 while sucking the gas in the processing chamber 10 with the vacuum pump 44.

The heating unit 50 includes a cylindrical heater 51 surrounding the cylindrical body 11 on the radially outer side the cylindrical body 11. The heater 51 heats each substrate W housed in the processing chamber 10 by heating the entire side periphery of the processing chamber 10.

As the controller 60, a computer having one or more processors 61, a memory 62, an input/output interface, and an electronic circuit (not illustrated) may be applied. The processor 61 is a combination of one or more of a CPU, an ASIC, an FPGA, a circuit consisting of multiple discrete semiconductors, and the like. The memory 62 includes a volatile memory, a nonvolatile memory (for example, a compact disc, DVD, a hard disk, flash memory, and the like), and stores a program for operating the substrate processing apparatus 1 and recipes such as process conditions for substrate processing. By executing the program and recipe stored in the memory 62, the processor 61 controls each configuration of the substrate processing apparatus 1 to implement the substrate processing method described above.
[Operation of Substrate Processing Apparatus]

The operation of the substrate processing apparatus 1 when the substrate processing method according to the embodiment is performed will be described. In the following, the case where the barrier film 103 is formed of silicon oxide is used as an example.

First, the controller 60 controls the lifting mechanism 21 to load the boat 20 holding the multiple substrates W into the processing chamber 10, and the opening of the lower end of the processing chamber 10 is airtightly sealed by the lid 15. Each of the substrates W is the substrate 101 having the target film 102 on its surface.

Subsequently, the controller 60 controls the gas supplier 30, the exhauster 40, and the heating unit 50 so as to perform the barrier film formation process S20. Specifically, first, the controller 60 controls the exhauster 40 to decompress the inside of the processing chamber 10 to a predetermined pressure, and controls the heating unit 50 to adjust and maintain the substrate temperature to a predetermined temperature. Then, the controller 60 controls the gas supplier 30 to alternately and repeatedly supply the silicon-containing gas and the oxygen gas into the processing chamber 10. As a result, a barrier film 103 formed by silicon oxide is formed on the target film 102. A purge gas may be supplied between the supply of the silicon-containing gas and the supply of the oxygen gas.

Subsequently, the controller 60 controls the gas supplier 30, the exhauster 40, and the heating unit 50 so as to perform the deuterium introduction process S30. Specifically, first, the controller 60 controls the exhauster 40 to decompress the inside of the processing chamber 10 to a predetermined pressure, and controls the heating unit 50 to adjust and maintain the substrate temperature to a predetermined temperature. The predetermined pressure is, for example, 1 Torr (133 Pa) or less. The predetermined temperature is, for example, 300° C. or more and less than 900° C. Then, the controller 60 controls the gas supplier 30 to supply the deuterium gas and the oxygen gas into the processing chamber 10. By supplying the deuterium gas and the oxygen gas into the processing chamber 10, the deuterium gas can be activated more than when only the deuterium gas is supplied into the processing chamber 10. As a result, deuterium is smoothly introduced into the target film 102, and the concentration of deuterium contained in the target film 102 increases. At this time, the target film 102 is covered with the barrier film 103 in which the amount of passing deuterium 104 is larger than the amount of passing oxygen. Therefore, the deuterium 104 passes through the barrier film 103 and is implanted into the target film 102, whereas oxygen is blocked by the barrier film 103 and is unlikely to be implanted into the target film 102. Thus, in the deuterium introduction step S30, the deuterium 104 can be implanted into the target film 102 while preventing oxygen implantation into the target film 102.

The controller 60 can adjust the concentration of deuterium introduced into the target film 102 by controlling a ratio of the flow rate of the deuterium gas to the flow rate of the oxygen gas (hereafter referred to as a "$D_2/O_2$ ratio") in the deuterium introduction step S30. For example, the $D_2/O_2$ ratio is preferably 2 or more and 20 or less. When the $D_2/O_2$ ratio is lower than 2, the oxide film thickness of the target film 102 tends to become thicker due to the increased concentration of oxygen in the processing chamber 10. When the $D_2/O_2$ ratio is higher than 20, the amount of deuterium taken into the target film 102 tends to decrease due to the low concentration of oxygen in the processing chamber 10.

Subsequently, the controller 60 controls the gas supplier 30, the exhauster 40, and the heating unit 50 so as to perform the barrier film removal process S40. Specifically, first, the controller 60 controls the exhauster 40 to decompress the inside of the processing chamber 10 to a predetermined pressure, and controls the heating unit 50 to adjust and maintain the substrate temperature to a predetermined temperature. Then, the controller 60 controls the gas supplier 30 to supply the hydrogen fluoride (HF) gas and the ammonia (NH₃) gas into the processing chamber 10. As a result, the hydrogen fluoride gas and the ammonia gas react with silicon oxide constituting the barrier film 103 to produce ammonium silicofluoride ($(NH_4)_2SiF_6$). Then, the controller 60 controls the heating unit 50 to heat the substrate to a predetermined temperature to sublimate the ammonium silicofluoride. Accordingly, silicon oxide is selectively etched, and the barrier film 103 on the target film 102 is removed.

Subsequently, the controller 60 raises the pressure in the processing chamber 10 to atmospheric pressure and lowers the temperature in the processing chamber 10 to the unloading temperature, and then controls the lifting mechanism 21 to unload the boat from the processing chamber 10.

As described above, by the substrate processing method according to the embodiment using the substrate processing apparatus 1, the target film 102 with a high concentration of deuterium and reduced surface oxidation can be formed.

[Experimental Result]

First, an experiment (hereafter referred to as "Experiment 1") was performed to evaluate the effect of difference in heat treatment conditions on the amount of deuterium introduced into the silicon nitride film, which is the target film 102, and the thickness of the oxide film formed on the surface of the silicon nitride film. In Experiment 1, first, in the substrate processing apparatus 1 described above, the silicon nitride film was subjected to heat treatment under two different conditions (Conditions A and B) below. Then, the concentration of deuterium contained in each silicon nitride film subjected to the heat treatment under Conditions A and B and the thickness of the oxide film formed on the surface of the silicon nitride film were measured.

(Condition A)

type of gas: deuterium gas pressure: 90 Torr (12 kPa)

temperature: 700° C.

time: 1 hour (Condition B)

type of gas: deuterium gas+oxygen gas pressure: 0.35 Torr (46.7 Pa)

temperature: 700° C. (same as Condition A)

time: 1 hour (same as Condition A)

Figure 4:
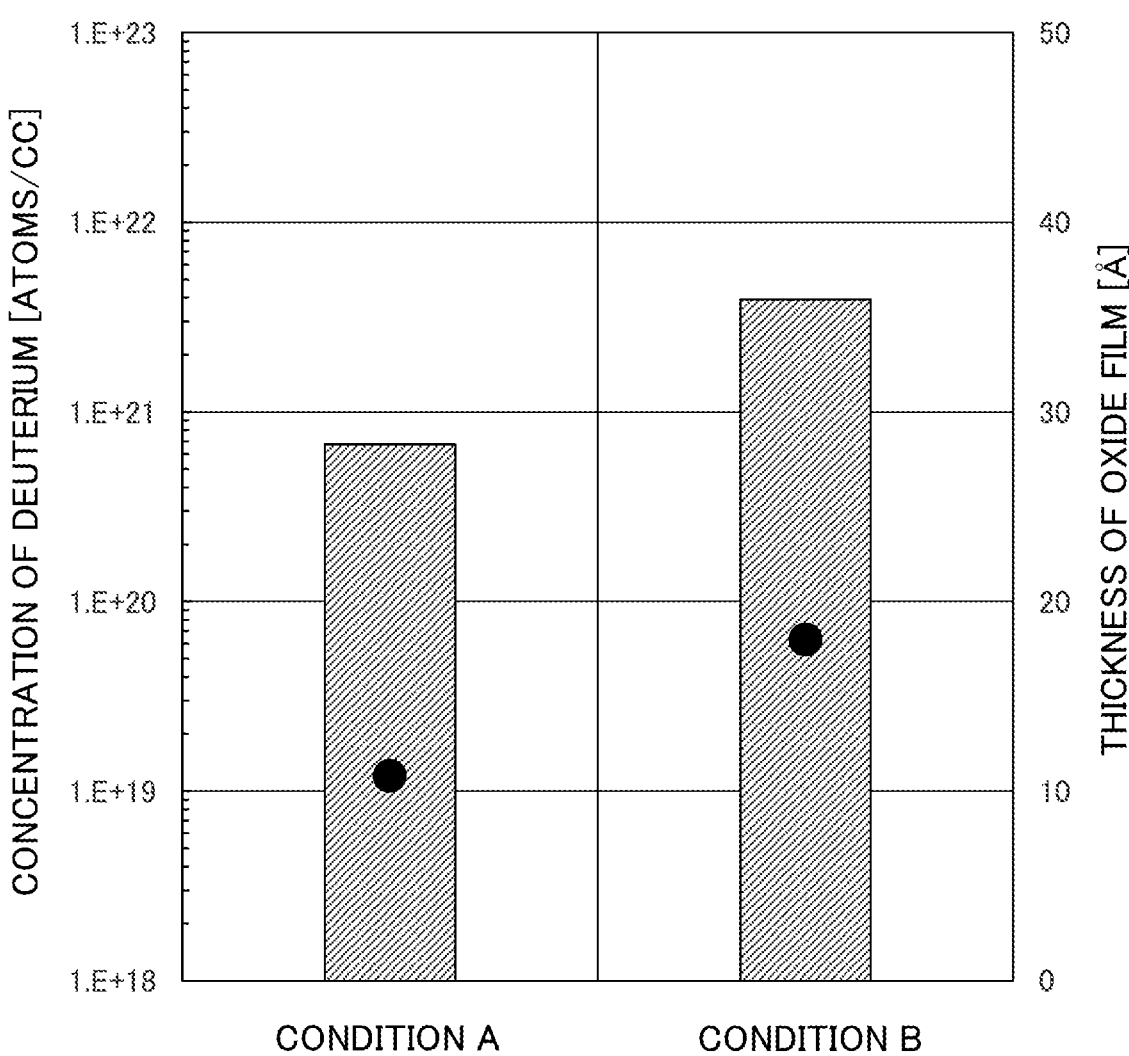
FIG. 4 is a schematic diagram illustrating a comparison result of concentration of deuterium and thickness of oxide films in Experiment 1.

FIG. 4 illustrates the comparison between the concentration of deuterium and the thickness of the oxide film in Experiment 1. In FIG. 4, the vertical axis on the left side illustrates the average value of the concentration (atoms/cc) of deuterium contained in the film from the surface of the silicon nitride to a thickness of 10 nm, and the vertical axis on the right side illustrates the thickness of the oxide film formed on the surface of the silicon nitride film. In FIG. 4, the bar graph illustrates the concentration of deuterium and the circles illustrate the thickness of the oxide film.

As illustrated in FIG. 4, it can be seen that the concentration of deuterium is higher in Condition B than in Condition A and the thickness of the oxide film is thicker. From this result, it can be said that heat treatment under the condition of supplying deuterium gas and oxygen gas can form a silicon nitride film with a higher concentration of deuterium than heat treatment under the condition of supplying deuterium gas without supplying oxygen gas, but the oxide film formed on the surface of the silicon nitride film becomes thicker. The thickness of the oxide film under the condition B is considered to be due to the oxidation of the surface of the silicon nitride film by oxygen radicals generated from oxygen gas.

Next, an experiment (hereafter referred to as "Experiment 2") was performed to evaluate the effect of the material difference of the barrier film 103 on the amount of deuterium introduced into the silicon nitride film, which is the target film 102. In Experiment 2, a test sample was prepared in which a silicon nitride film and a barrier film 103 formed from various materials (silicon oxide, aluminum oxide, polysilicon) were stacked in this order on a bare silicon wafer. For comparison, a test sample was prepared in which a silicon nitride film was formed on a bare silicon wafer and a barrier film 103 was not formed. Then, in the substrate processing apparatus 1 described above, heat treatment was performed on the prepared test sample under the same condition C below. Then, the concentration of deuterium contained in the silicon nitride film was measured for each heat-treated test sample.

(Condition C)

type of gas: deuterium gas pressure: 90 Torr (12 kPa)

temperature: 700° C.

time: 3 hours

Figure 5:
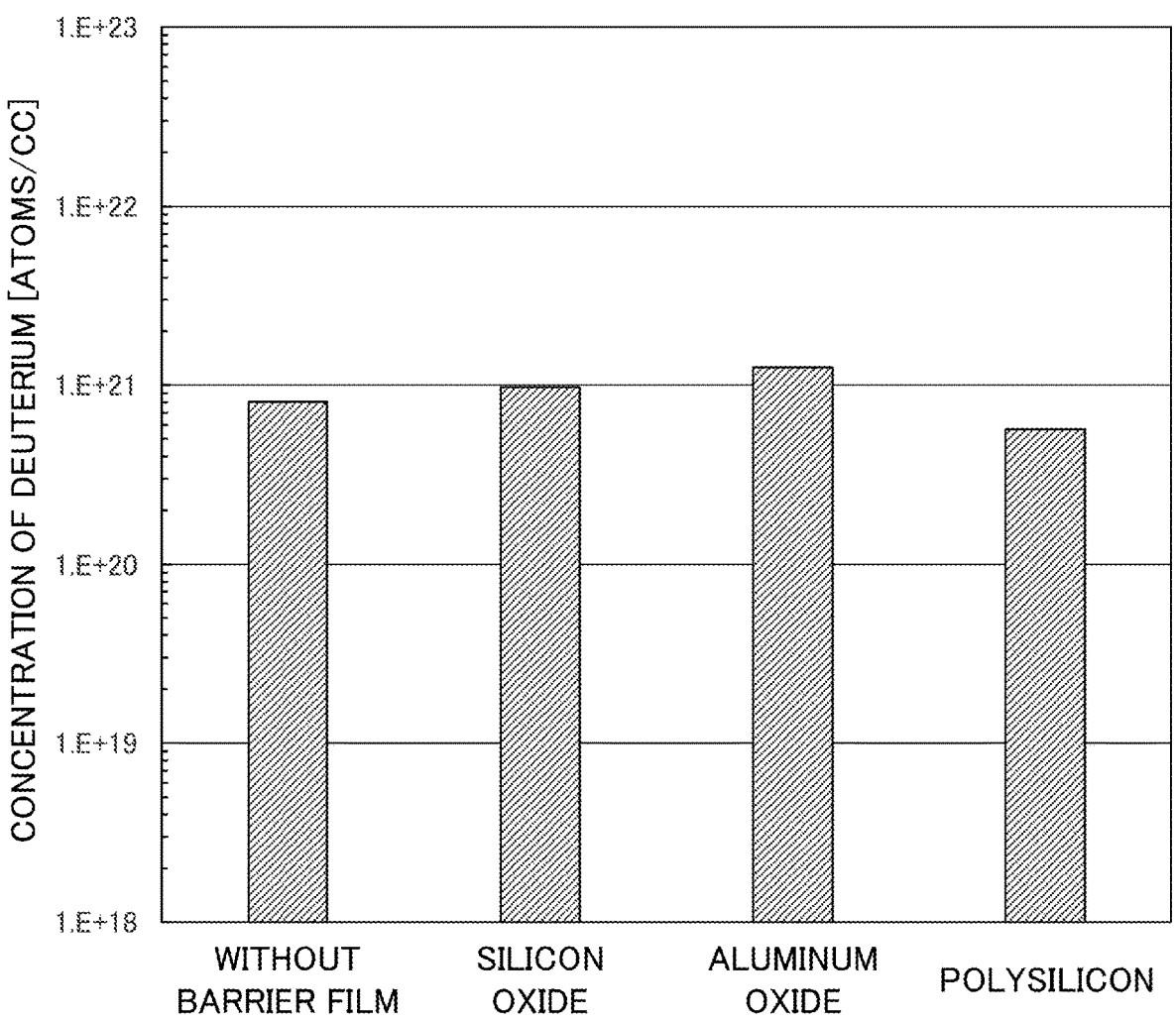
FIG. 5 is a schematic diagram illustrating a comparison result of concentration of deuterium in Experiment 2.

FIG. 5 illustrates the comparison of deuterium concentrations in Experiment 2. In FIG. 5, the vertical axis illustrates the concentration (atoms/cc) of deuterium contained in the film up to 10 nm thick from the surface of the silicon nitride film. The bar graphs in FIG. 5 illustrate, from left to right, the results without barrier film 103, with barrier film 103 formed of silicon oxide, with barrier film 103 formed of aluminum oxide, and with barrier film 103 formed of polysilicon.

As illustrated in FIG. 5, there is a slight difference in the concentration of deuterium contained in the silicon nitride film between the case with barrier film 103 and the case without barrier film 103, but it is considered to be within the range of variation. From this result, it is considered that deuterium passes through the barrier film 103 formed by silicon oxide, aluminum oxide or polysilicon and causes little effect on the amount of deuterium introduced into the silicon nitride film.

The presently disclosed embodiment should be considered illustrative in all respects and not restrictive. The above embodiment may be omitted, replaced or modified in various forms without departing from the scope and purport of the attached claims.

According to the present disclosure, a film with a high concentration of deuterium and reduced surface oxidation can be formed.

What is claimed is:

1. A substrate processing method comprising:

preparing a substrate having a target film on a surface;

forming a barrier film that covers the target film;

supplying a deuterium gas and an oxygen gas to the target film covered with the barrier film, thereby implanting deuterium into the target film; and removing the barrier film after the deuterium is implanted into the target film.

2. The substrate processing method according to claim 1, wherein the forming of the barrier film, the implanting of the deuterium, and the removing of the barrier film are performed in a same processing chamber.

3. The substrate processing method according to claim 2, wherein the target film is a film containing silicon and nitrogen.

4. The substrate processing method according to claim 3, wherein the target film is a silicon nitride film or a silicon oxynitride film.

5. The substrate processing method according to claim 1, wherein the implanting of the deuterium includes:

housing the substrate in a processing chamber that is depressurized to 1 Torr or less;

maintaining the substrate at a temperature of 300° C. or more and less than 900° C.; and supplying the deuterium gas and the oxygen gas into the processing chamber.

6. The substrate processing method according to claim 5, wherein a ratio of a flow rate of the deuterium gas to a flow rate of the oxygen gas supplied into the processing chamber is 2 or more and 20 or less.

7. The substrate processing method according to claim 6, wherein the target film is a film containing silicon and nitrogen.

8. The substrate processing method according to claim 7, wherein the target film is a silicon nitride film or a silicon oxynitride film.

9. The substrate processing method according to claim 5, wherein the target film is a film containing silicon and nitrogen.

10. The substrate processing method according to claim 9, wherein the target film is a silicon nitride film or a silicon oxynitride film.

11. The substrate processing method according to claim 1, wherein the barrier film is a film in which an amount of passing the deuterium is larger than an amount of passing oxygen.

12. The substrate processing method according to claim 11, wherein the target film is a film containing silicon and nitrogen.

13. The substrate processing method according to claim 12, wherein the target film is a silicon nitride film or a silicon oxynitride film.

14. The substrate processing method according to claim 1, wherein the barrier film includes silicon oxide, aluminum oxide, or polysilicon.

15. The substrate processing method according to claim 14, wherein the target film is a film containing silicon and nitrogen.

16. The substrate processing method according to claim 15, wherein the target film is a silicon nitride film or a silicon oxynitride film.

17. The substrate processing method according to claim 1, wherein the barrier film includes silicon oxide, and the removing of the barrier film includes supplying a hydrogen fluoride gas and an ammonia gas to the substrate.

18. The substrate processing method according to claim 1, wherein the target film is a film containing silicon and nitrogen.

19. The substrate processing method according to claim 18, wherein the target film is a silicon nitride film or a silicon oxynitride film.

20. A substrate processing apparatus comprising:

a processing chamber;

a gas supplier; and a controller, wherein the controller includes a processor, a memory, and a program stored in the memory, wherein the program, when executed, causes the substrate processing apparatus to:

house a substrate having a target film on a surface in the processing chamber;

form a barrier film that covers the target film in the processing chamber;

supply, from the gas supplier, a deuterium gas and an oxygen gas into the processing chamber, thereby implanting deuterium into the target film covered with the barrier film; and remove the barrier film in the processing chamber after the deuterium is implanted into the target film.

\* \* \* \* \*